United States Patent
Redpath

(10) Patent No.: US 9,683,730 B1
(45) Date of Patent: Jun. 20, 2017

(54) SYSTEM AND METHOD OF OPTIMIZING WHITE LIGHT

(71) Applicant: Parhelion Incorporated, Wilmington, DE (US)

(72) Inventor: Richard Redpath, Cary, NC (US)

(73) Assignee: PARHELION INCORPORATED, Wilmington, DE (US)

( * ) Notice: Subject to any disclaimer, the term of this patent is extended or adjusted under 35 U.S.C. 154(b) by 0 days.

(21) Appl. No.: 15/277,652

(22) Filed: Sep. 27, 2016

Related U.S. Application Data

(60) Provisional application No. 62/292,787, filed on Feb. 8, 2016.

(51) Int. Cl.
| F21V 9/16 | (2006.01) |
| F21V 29/70 | (2015.01) |
| F21V 29/89 | (2015.01) |
| F21V 3/00 | (2015.01) |
| F21V 9/08 | (2006.01) |
| F21K 9/64 | (2016.01) |
| F21V 7/00 | (2006.01) |
| F21Y 115/30 | (2016.01) |

(52) U.S. Cl.
CPC .............. *F21V 29/70* (2015.01); *F21K 9/64* (2016.08); *F21V 3/00* (2013.01); *F21V 7/00* (2013.01); *F21V 9/08* (2013.01); *F21V 9/16* (2013.01); *F21V 29/89* (2015.01); *F21Y 2115/30* (2016.08)

(58) Field of Classification Search
CPC .................................... F21K 9/64; F21V 3/00
See application file for complete search history.

(56) References Cited

U.S. PATENT DOCUMENTS

| 2007/0091617 | A1* | 4/2007 | Couzin | G02B 5/021 362/341 |
| 2011/0157865 | A1* | 6/2011 | Takahashi | F21S 48/115 362/84 |
| 2013/0077286 | A1* | 3/2013 | Hu | F21V 23/002 362/85 |
| 2014/0063779 | A1* | 3/2014 | Bradford | F21K 9/1375 362/84 |
| 2016/0195231 | A1* | 7/2016 | Grotsch | F21S 48/114 362/19 |
| 2016/0327245 | A1* | 11/2016 | Pijlman | F21S 48/1757 |

* cited by examiner

*Primary Examiner* — Evan Dzierzynski
(74) *Attorney, Agent, or Firm* — Ming Chow; Sinorica, LLC

(57) ABSTRACT

The apparatus is designed to modify the quality of a beam of light while maximizing the amount of light directed along a desired trajectory. The light optimization device contains an aperture, a diffuser, a modifying substrate, and a mirror. The aperture enables light to travel through the mirror. The diffuser splits a single beam of light traveling towards the modifying substrate into multiple beams of light, which are traveling towards the modifying substrate. The modifying substrate becomes excited when struck by light, and then produces light with desired characteristics. The mirror reflects light that is generated by, or reflected off of, the modifying substrate, and traveling along suboptimal trajectories. As such, the reflected light is redirected towards the modifying substrate.

19 Claims, 11 Drawing Sheets

SYSTEM AND METHOD OF OPTIMIZING WHITE LIGHT

The current application claims a priority to the U.S. Provisional Patent application Ser. No. 62/292,787 filed on Feb. 8, 2016.

FIELD OF THE INVENTION

The present invention relates generally to a device that intensifies the light produced by a light source, more particularly to a device that increases the amount of perceived light emanating from a phosphoric substrate. A user of the present invention will be able to manufacture a device which first diffracts light into multiple beams, uses these beams to energize a phosphoric substrate, and then reflects the light that is generated by the phosphoric substrate and traveling along suboptimal trajectories; such that, the optimal amount of perceivable light is produced.

BACKGROUND OF THE INVENTION

Traditional lightbulbs feature clear housings which do not modify the color of the produced light. These lightbulbs produce a somewhat harsh light that many find off putting. To counteract this displeasing effect, layers of diffusion material are frequently applied to lightbulbs. These diffusion layers soften the light and modify its characteristics. Building upon this idea, it is possible to produce light with desired characteristics by using various combinations of light and diffusion materials. For example, white light is produced by shining a blue light onto a layer of phosphoric material.

Although this method of light modification produces light with desired properties, a significant amount of the perceivable light is lost. This loss is due to the fact that a portion of the light is reflected off of the diffusion material and some of the radiant conversion is back not forward. Because some of the light is lost, a user must employ more powerful light sources to achieve a desired level of brightness. This practice wastes energy and costs user's money.

Therefore, the object of the present invention is to employ a mirror to redirect light which would otherwise be lost. The present invention uses an arrangement of components that enable light to pass through an aperture in a mirror. The aperture enables light to enter a diffuser, which splits the light into multiple beams, before it strikes a modifying substrate. Additionally, this aperture is sufficiently small that light is prevented from passing through in the opposite direction. Once the multiple beams of light strike the modifying substrate, a portion of the light is directed backwards. However, because of the mirror the light which would normally be lost is reflected back towards the modifying substrate. Using the diffuser to spread the source light, and the mirror to redirect wasted light, increases the efficiency of the present invention.

The method of use for the present invention employs a diffuser optical material with Gaussian profile that diffracts collimated blue laser beam (single wavelength) to produce multiple beams. These beams then strike an illuminate material (phosphor) substrate that is attuned to the wavelength of the blue laser. Thus converting the blue laser beams into white light. In addition to the illuminate material, the diffuser optical material is attuned to a specific light wavelength to provide resulting output pattern of beams (e.g., Gaussian profile). Furthermore, other wavelengths of light pass through the diffuser optical material unhindered.

The use of a diffractive optical element (DOE) creates multiple beams to prevent saturation of the illuminate material substrate by a single beam of light. However, a single beam could be used, and would also reflect back unconverted blue light as well as converted white light. A majority of the produced white is directed forward, while some is directed back. Additionally, some of the not fully converted blue laser beams that do not make it through the illuminate material or DOE are directed backwards. The mirror reflects the blue light forward again. Because the white light is a different wavelength it easily passes through the DOE and the illuminate material. In addition, any blue light that was not converted is also reflected back by the mirror through the DOE and converted to white light by the illuminate material substrate.

DETAIL DESCRIPTIONS OF THE INVENTION

All illustrations of the drawings are for the purpose of describing selected versions of the present invention and are not intended to limit the scope of the present invention.

In reference to FIG. 1 through FIG. 11, the preferred embodiment of the present invention is a system and method of optimizing white light. The present invention is a device that employs an optical diffuser, a phosphoric substrate, and mirrors to optimize the light produced by a lamp. To accomplish this, the present invention uses a luminescent material that is energized by a beam of light that has first been split into multiple beams by an optical diffuser. A portion of the light generated by the energized luminescent material is directed along a suboptimal trajectory, and is therefore wasted. Additionally, a portion of the light beams that strike the luminescent material are reflected towards the mirror without being converted. The mirrors used in the present invention are positioned to reflect this wasted light back towards the luminescent material. A portion of the reflected light energizes the luminescent material, while another portion passes through the luminescent material. Again, a portion of the light generated by the luminescent material is directed towards the mirrors, and again the mirrors reflect this light towards the luminescent material. This process is repeated, and thus the present invention is used to optimize the light produced by a lamp.

Figure 1:
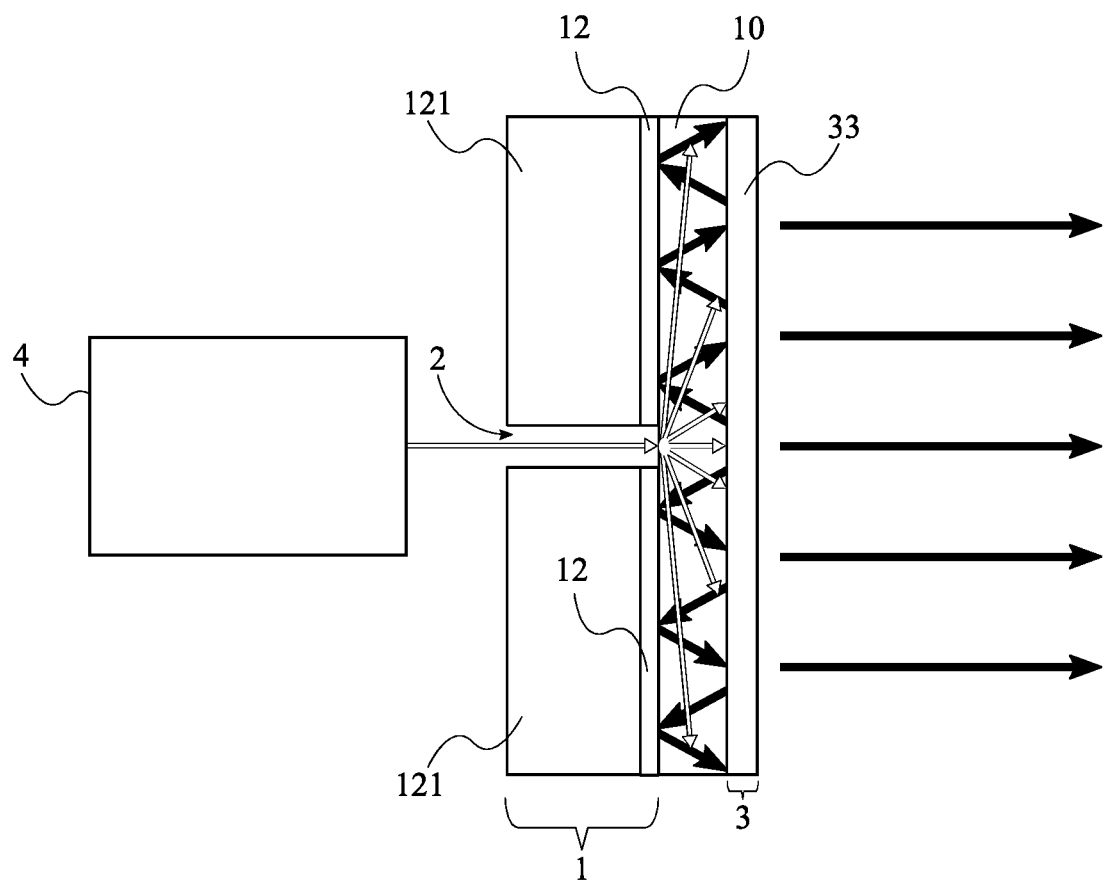
FIG. 1 is a schematic view of the present invention. In this schematic view, hollow arrows represent beams of light that have yet to come into contact with the luminescent material coating, Conversely, bold arrows represent beams of light that have already come into contact with the luminescent material coating. Light being generated by the light source passes through the transmission hole, is split by the diffractive optical element, and then excites the luminescent material coating. The excited luminescent material coating generates light in multiple directions. A portion of the light is directed back towards the optical diaphragm. and is then redirected towards the luminescent material coating.

In reference to FIG. 1, the preferred embodiment of the present invention, the system and method of optimizing white light, comprises an optical diaphragm 1, a transmission hole 2, a diffractive optical element 10, and a radiant conversion device 3. The term radiant conversion device 3 is used herein to refer to a transparent material that has a layer of fluorescent, phosphorescent, or similar luminescent material superimposed onto at least one exterior surface. The optical diaphragm 1 is an aperture stop that is preferably a mirror-effect device which is used to reflect light towards the radiant conversion device 3. The optical diaphragm 1 can be, but is not limited to, a back-panel mirror, front surface mirror highly polished aluminum, and front surface mirror highly polished silver. Preferably the optical diaphragm 1 is a front surface mirror for best efficiency. The transmission hole 2 enables light to pass through the optical diaphragm 1 where it is split by the diffractive optical element 10 before energizing the radiant conversion device 3. The radiant conversion device 3 is in optical communication with the optical diaphragm 1 through the diffractive optical element 10 so that light beams are split prior to striking the radiant conversion device 3. Additionally, a portion of the light that strikes, and is generated by, the radiant conversion device 3 is able to contact a reflective surface 12 of the optical diaphragm 1. The transmission hole 2 traverses through the optical diaphragm 1 so that beams of light are able to pass through the transmission hole 2. The transmission hole 2 is oriented towards the radiant conversion device 3. As a result, beams of light are able to travel through the transmission hole 2 and energize the radiant conversion device 3. In the preferred embodiment of the present invention, the diameter of the transmission hole 2 is sufficiently wide to enable a beam of light to pass through the diffractive optical element 10 prior to coming into contact with the radiant conversion device 3. Additionally, the diameter of the transmission hole 2 is sufficiently narrow, such that the light generated by the radiant conversion device 3 is prevented from passing back through the transmission hole 2. More specifically, the transmission hole 2 can be, but is not limited to, a 3 mm or a 10 mm diameter hole.

Figure 2:
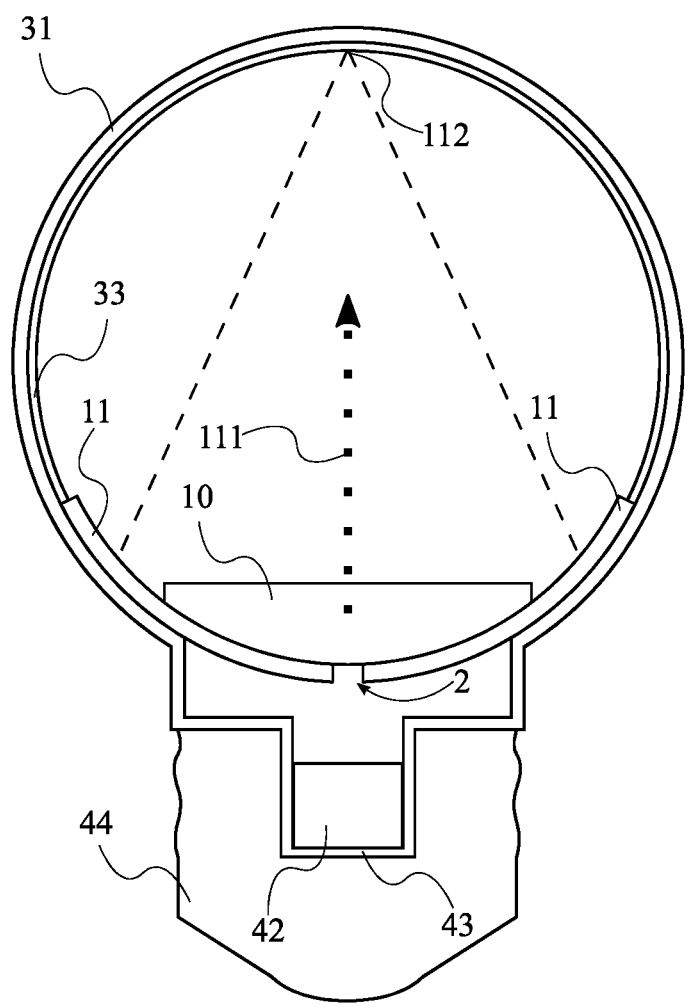
FIG. 2 is a schematic view of a first possible embodiment of the present invention. In this schematic view, dashed lines indicate the trajectory along which light travels after being reflected by the concave mirror assembly. The dashed lines intersect at the position of the focus of the concave mirror assembly.

In reference to FIG. 2, in a first alternative embodiment of the present invention, the radiant conversion device 3 comprises a transparent enclosure 31 and a luminescent material coating 33 In this embodiment, the radiant conversion device 3 is a bulb-like housing similar to a traditional lightbulb. The optical diaphragm 1 is a concave mirror assembly 11. Consequently, the optical diaphragm 1 is able to direct light towards a desired focal point. In this embodiment, the concave mirror assembly 11 reduces the dispersion angle of the light emanating from the luminescent material coating 33 that is superimposed onto a focusing surface of the transparent enclosure 31. Consequently, the light passing through the transmission hole 2, being dispersed by the diffractive optical element 10, or being reflected by the optical diaphragm 1, comes into contact with the luminescent material coating 33. Additionally, superimposing the luminescent material coating 33 within the transparent enclosure 31 prevents the luminescent material coating 33 from coming into contact with scratching hazards in the external environment. The concave mirror assembly 11 is mounted within the transparent enclosure 31. As a result, the optical diaphragm 1 is able to reflect the light generated by the luminescent material coating 33 towards a desired focal point; prior to the light passing through the transparent enclosure 31. The transmission hole 2 traverses into the transparent enclosure 31 and through the concave mirror assembly 11. Consequently, the transmission hole 2 enables light to pass into the transparent enclosure 31 without first coming into contact with the luminescent material coating 33. The transmission hole 2 is aligned along a principal axis 111 of the concave mirror assembly 11 so that light passing into the transparent enclosure 31 passes though the transmission hole 2 at the center of the concave mirror assembly 11. A focus 112 of the concave mirror assembly 11 is positioned coincident with the luminescent material coating 33. As a result, the light that is generated by the luminescent material coating 33 and directed towards the concave mirror assembly 11 is reflected back toward the luminescent material coating 33. In the first alternative embodiment of the present invention, the focusing surface is an internal surface of the transparent enclosure 31. Consequently, the light reflected by the concave mirror assembly 11 is focused onto the focusing surface within the transparent enclosure 31. Additionally, in this first alternative embodiment, the transparent enclosure 31 is a bulbus shape. In the first alternative embodiment of the present invention, the concave mirror assembly 11 is a single continuous mirror. As a result, the light being reflected by the concave mirror assembly 11 is uniformly reflected towards the focusing surface.

Figure 3:
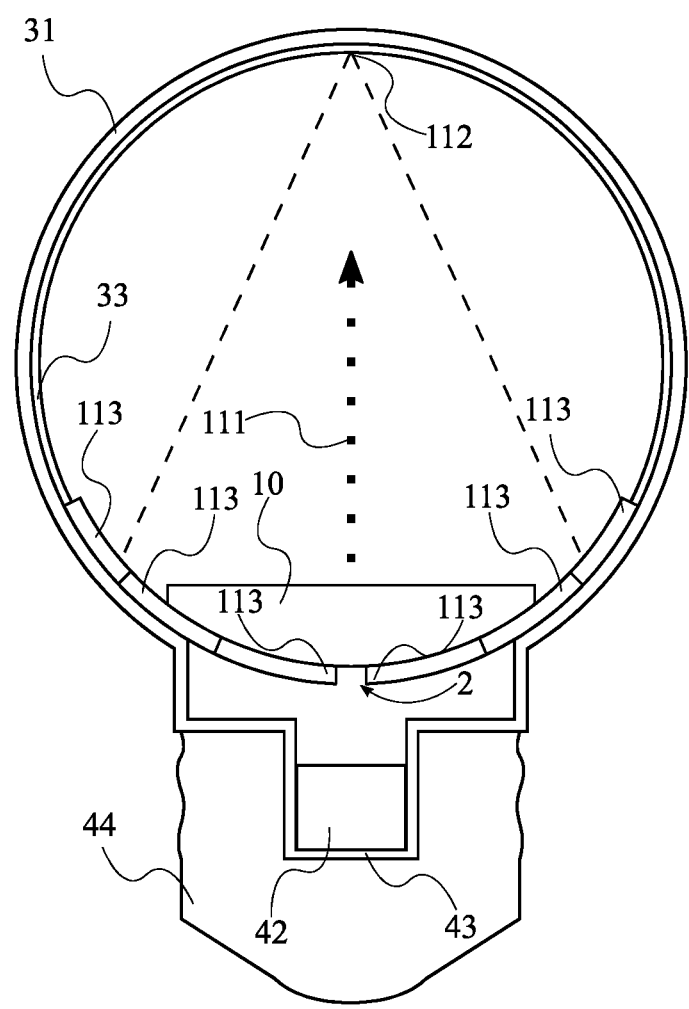
FIG. 3 is a schematic view of a fourth possible embodiment of the present invention. In this schematic view, dashed lines indicate the trajectory along which light travels after being reflected by the plurality of assembly portions. The dashed lines intersect at the position of the focus of the concave mirror assembly.

In reference to FIG. 3, in a fourth alternative embodiment of the present invention, the concave mirror assembly 11 is a reflection device that comprises a plurality of assembly portions 113. The plurality of assembly portions 113 is a collection of mirrors that are arranged into a uniform reflective surface. Consequently, the concave mirror assembly 11 is able to focus the light generated by the luminescent material coating 33 onto the focusing surface.

Figure 4:
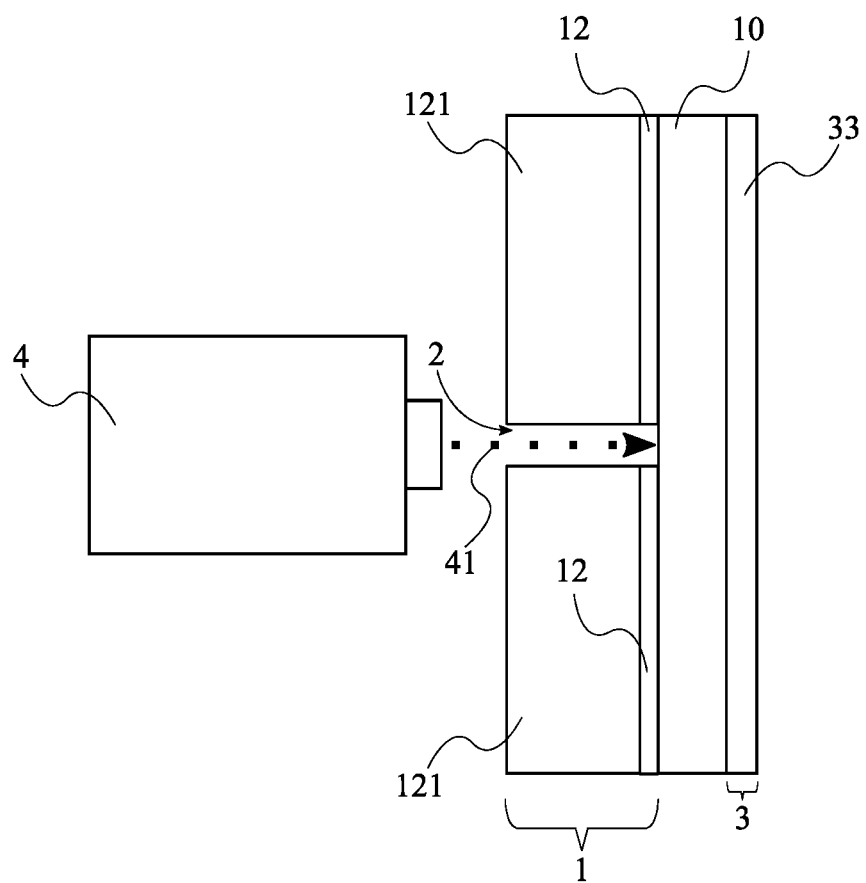
FIG. 4 is a schematic view of a second possible embodiment of the present invention. In this schematic view, the emission axis of the collimated light source is indicated by a dotted line.

In reference to FIG. 4, the preferred embodiment of the present invention further comprises a light source 4 that is used to energize the radiant conversion device 3. The light source 4 is mounted offset from the optical diaphragm 1, opposite to the radiant conversion device 3 so that the light source 4 is maintained in a position that facilitates energizing the radiant conversion device 3. An imaginary emission axis 41 of the light source 4 is collinearly aligned with the transmission hole 2. Consequently, a light beam produced by the light source 4 is able to pass through the transmission hole 2. The imaginary emission axis 41 of the light source 4 is oriented towards the radiant conversion device 3 so that the light beam produced by the light source 4 comes into contact with, and energizes, the radiant conversion device 3 after being split by the diffractive optical element 10. In a second alternative embodiment of the present invention, the light source 4 is a collimated light source. As a result, the light beam used to energize the radiant conversion device 3 has minimal divergence. In this second alternative embodiment the light source 4 can be, but is not limited to, a blue laser, or another type of device that produces light with low divergence.

Figure 5:
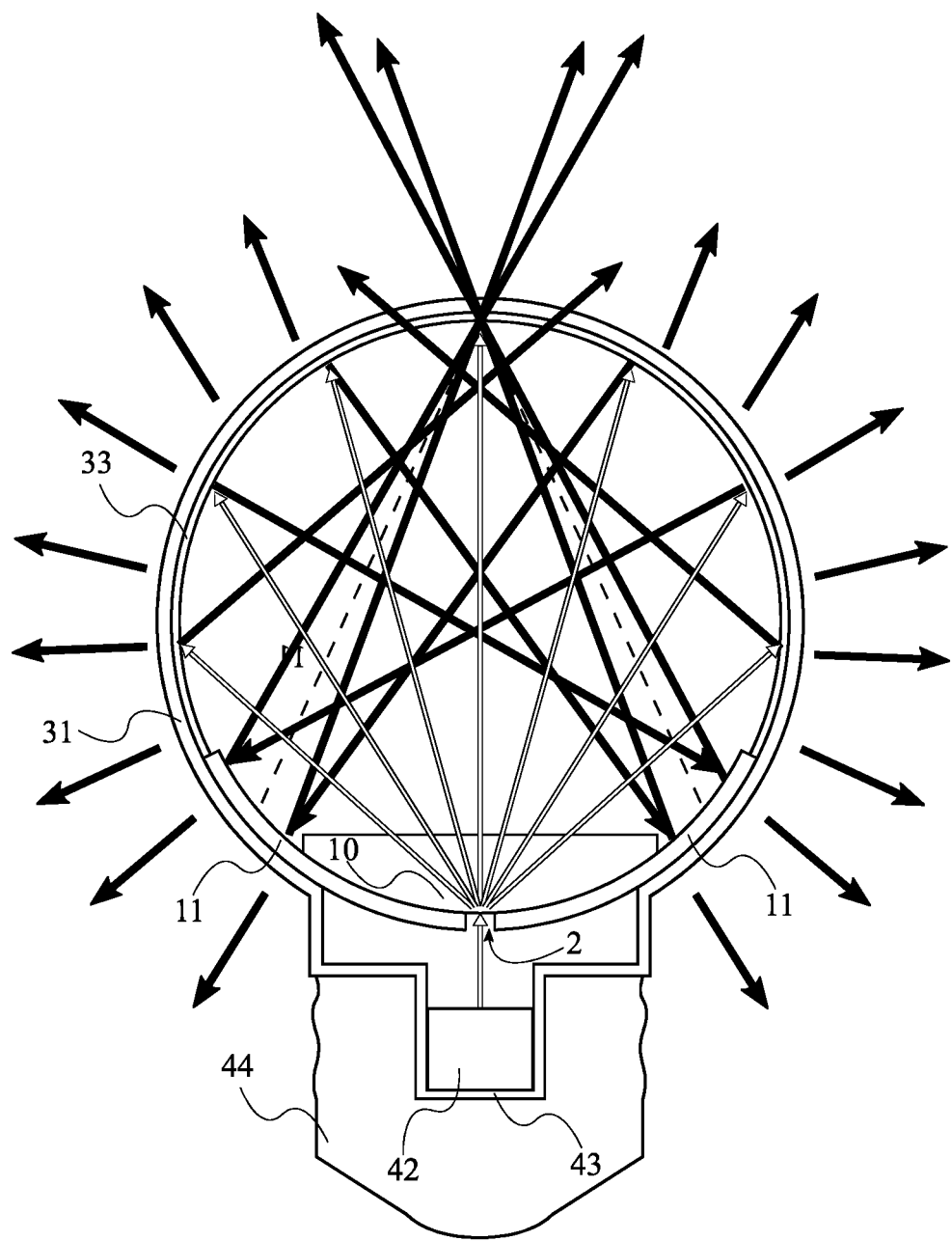
FIG. 5 is a schematic view of the first possible embodiment of the present invention. In this schematic view, hollow arrows represent beams of light that have yet to come into contact with the luminescent material coating, Conversely, bold arrows represent beams of light that have already come into contact with the luminescent material coating. The at least one lamp directs beams of light towards the luminescent material coating. A portion of these beams of light are directed back towards the concave mirror assembly. The dashed lines intersect at the position of the focus of the concave mirror assembly.

In reference to FIG. 5, the first alternative embodiment of the present invention, the light source 4 further comprises at least one lamp 42, a support platform 43, and a base 44. In this first alternative embodiment, the at least one lamp 42 emits light that travels through the transmission hole 2 and the diffractive optical element 10 before passing into the transparent enclosure 31. The light emitted by the at least one lamp 42 then energizes the luminescent material coating 33 after being split by the diffractive optical element 10. As described above, the portion of light that is directed towards the concave mirror 11 is reflected back towards the luminescent material coating 33. The at least one lamp 42 is distributed onto and across the support platform 43 so that generated light is directed towards the luminescent material coating 33. The at least one lamp 42 can be, but is not limited to, laser diode (LD), laser arrays, and light bulb arrays. The base 44 is adjacently connected to the support platform 43 opposite to the at least one lamp 43. Consequently, the base 44 maintains the support platform 43 in an orientation which enables the at least one lamp 42 to direct light through the transmission hole 2 and into the transparent enclosure 31. The at least one lamp 42 is electrically connected to the base 44 so that any electrical power supplied to the base 44 is used to power the at least one lamp 42. In this first alternative embodiment, the base 44 is designed similarly to the base of a traditional light bulb. This enables the base 44 to be mechanically mounted into, and electrically connected to, traditional lightbulb sockets.

Figure 7:
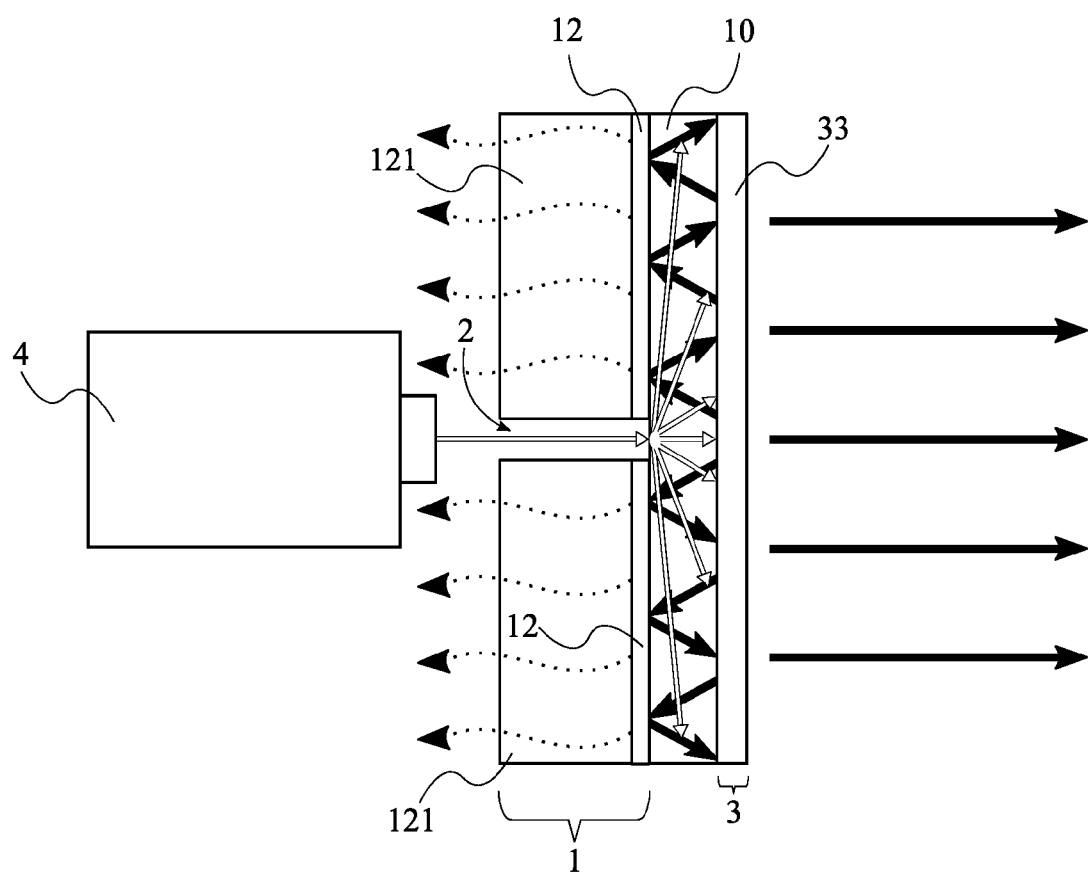
FIG. 7 is a schematic view of the second possible embodiment of the present invention. In this schematic view, hollow arrows represent beams of light that have yet to come into contact with the luminescent material coating, Conversely, bold arrows represent beams of light that have already come into contact with the luminescent material coating. Light being generated by the light source passes through the transmission hole, is split by the diffractive optical element, and then excites the luminescent material coating. The excited luminescent material coating generates light in multiple directions. A portion of the light is directed back towards the optical diaphragm. and is then redirected towards the luminescent material coating. Furthermore, the dotted lines indicate heat being transferred through the heat sinking layer.

In reference to FIG. 7, the second alternative embodiment of the present invention makes use of a flat radiant conversion device 3 that is maintained in an orientation that is parallel to a flat surface of the optical diaphragm 1. In this second alternative embodiment, the radiant conversion device 3 comprises a luminescent material coating 33. The optical diaphragm 1 comprises a reflective surface 12 and a heat sinking layer 121. The luminescent material coating 33 is superimposed onto the diffractive optical element 10 so that light generated by the light source 4 energizes the luminescent material coating 33, after passing through the diffractive optical element 10. To that end, the diffractive optical element 10 is positioned in between the luminescent material coating 33 and the reflective surface 12. The diffractive optical element 10 can be, but is not limited to, a 1.3 mm thick slab of optical grade plastic or fused quartz. The diffractive optical element 10 is preferably a Gaussian diffuser that is attuned to diffract light with a wavelength of 450 nanoseconds. The reflective surface 12 is superimposed onto the heat sinking layer 121. As a result, the reflective surface 12 is able to reflect the portion of the light that is generated by the luminescent material coating 33. That is, the light which is directed towards the reflective surface 12 is reflected back towards the luminescent material coating 33. To that end, the reflective surface 12 is positioned in between the heat sinking layer 121 and the diffractive optical element 10. Moreover, the heat sinking layer 121 is used to dissipate heat generated by light being reflected off of the reflective surface 12. The heat sinking layer 121 is preferably made of aluminum. The luminescent material coating 33 is superimposed onto the diffractive optical element 10 preferably by an adhesion layer.

Figure 6:
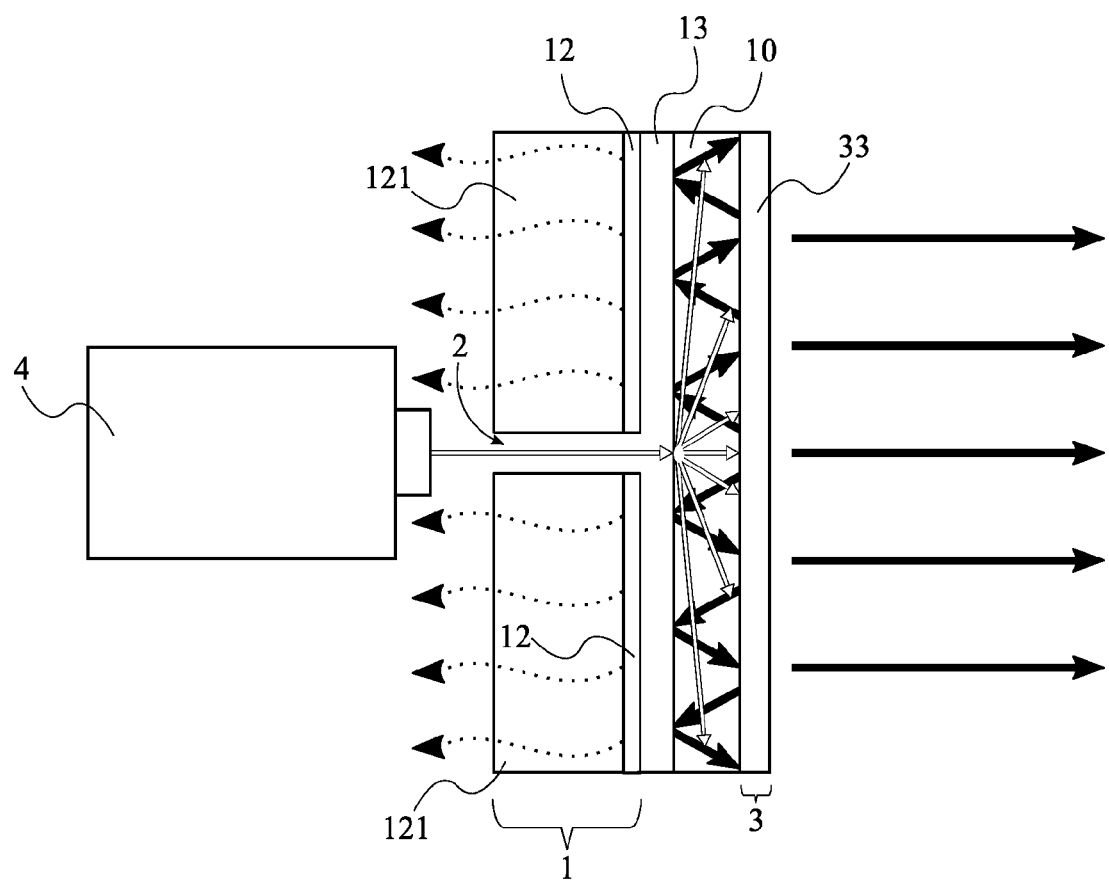
FIG. 6 is a schematic view of the fifth possible embodiment of the present invention. In this schematic view, the reflective surface is offset from the diffractive optical element by an insulation gap.

In reference to FIG. 6, in a fifth alternative embodiment of the present invention, the reflective surface 12 and the diffractive optical element 10 are offset from each other by a heat insulation gap 13. As a result, the heat generated by the reflective surface 12 is prevented from being transferred to the diffractive optical element 10 by the insulation gap 13.

Figure 8:
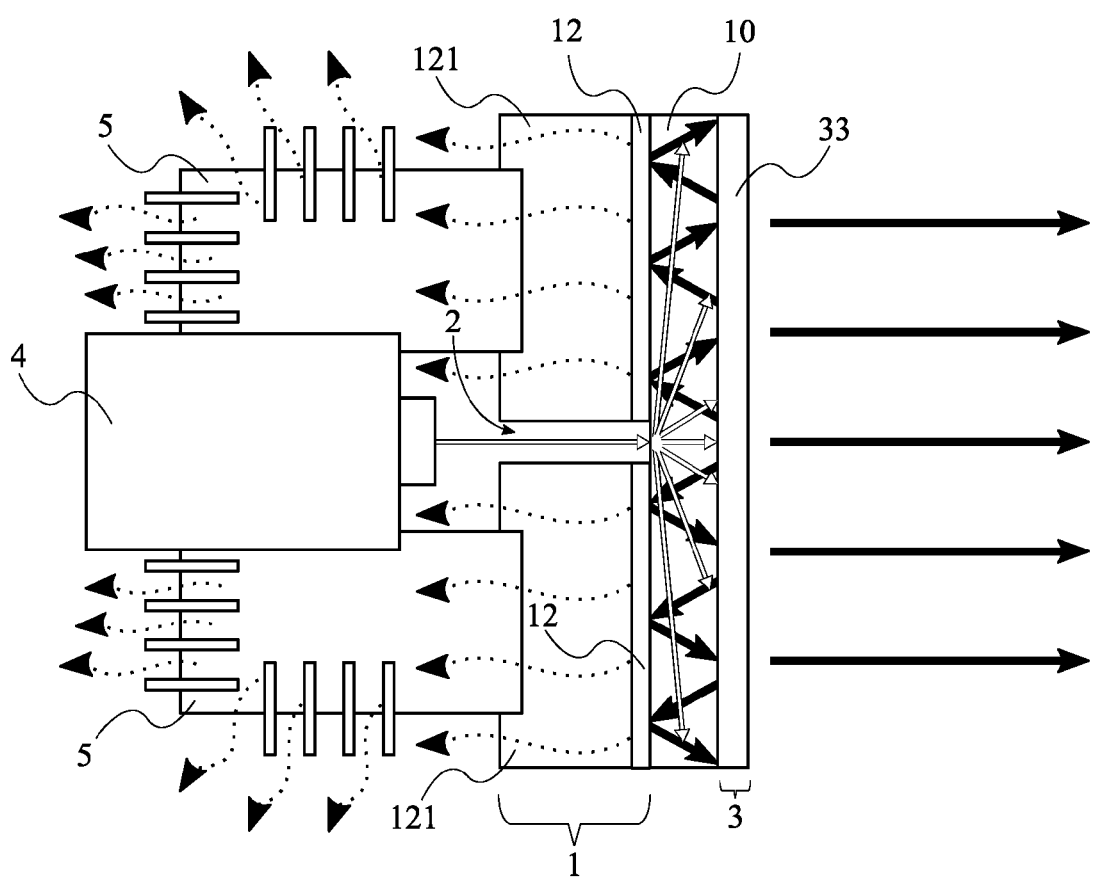
FIG. 8 is a schematic view of the third possible embodiment of the present invention. In this schematic view, the heat sinking body is mounted adjacent to the heat sinking layer. Dotted lines indicate heat being transferred from the heat sinking layer, through the heat sinking body, and into the ambient environment.

In reference to FIG. 8, a third embodiment of the present invention further comprise a heat sinking body 5 which facilitates dissipating heat from the optical diaphragm 1. The heat sinking body 5 is mounted adjacent to the heat sinking layer 121, opposite to the reflective surface 12. Additionally, the heat sinking body 5 is in thermal communication with the heat sinking layer 121. Consequently, the heat sinking body 5 is able to dissipate the heat conducted through the heat sinking layer 121 into the ambient environment. In the third alternative embodiment of the present invention, the heat sinking body 5 is designed similarly to a traditional heat sink. Additionally, the heat sinking body 5 is mounted adjacent to the heat sinking layer 121 such that light generated by the light source 4 is able to pass unimpeded through the transmission hole 2.

Figure 9:
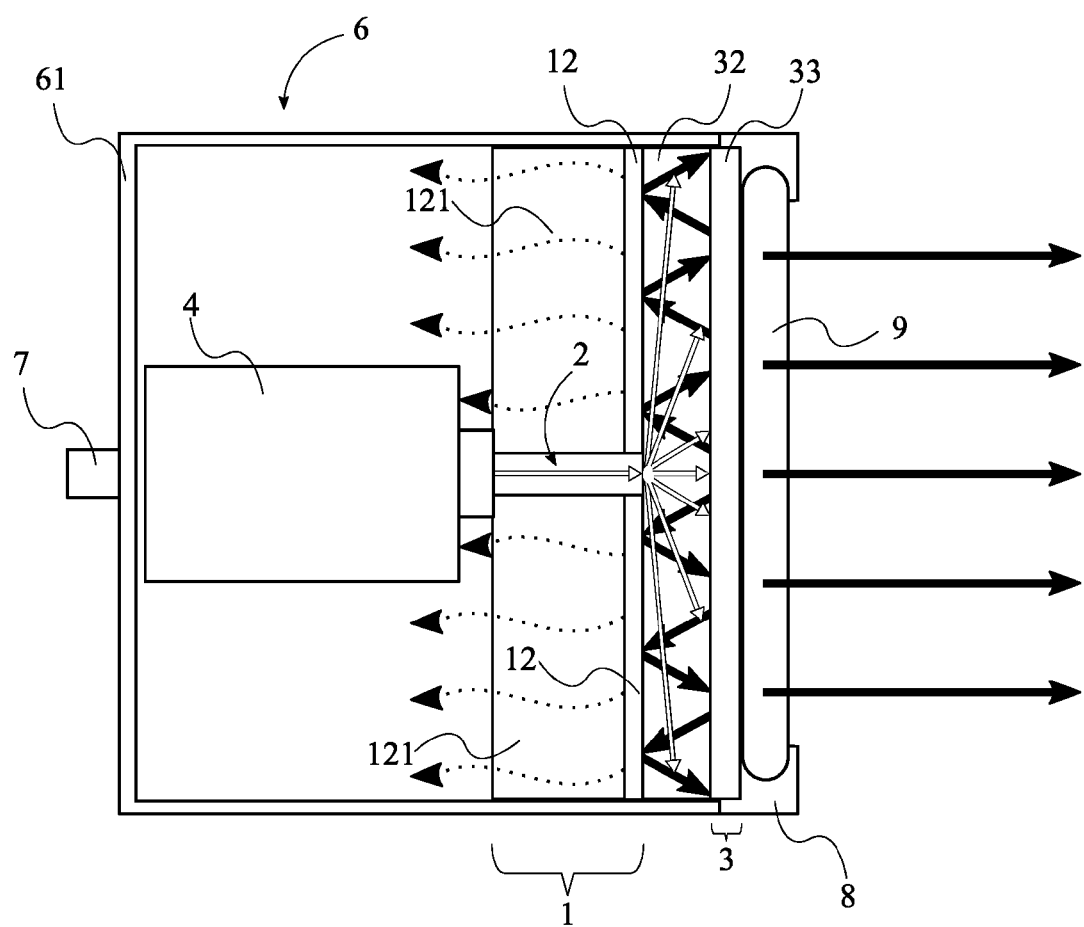
FIG. 9 is a schematic view of the second possible embodiment of the present invention. In this schematic view, the tubular housing encases the collimated light source, the optical diaphragm, the radiant conversion device, and the lens. The face cap is connected to the tubular housing adjacent to the open end of the tubular housing.
Figure 10:
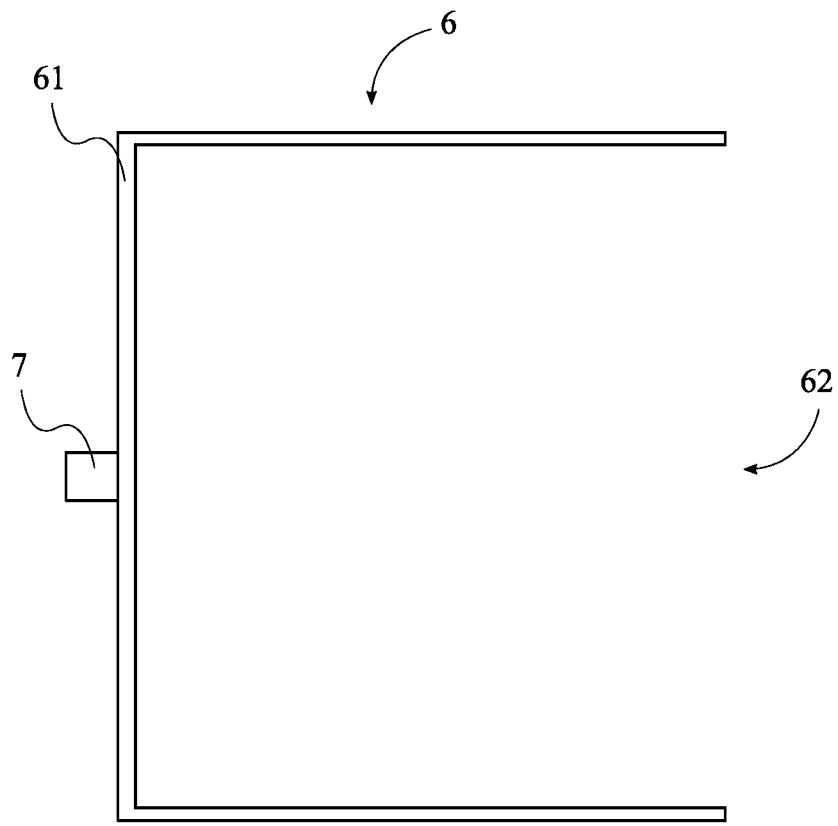
FIG. 10 is a schematic view of the second possible embodiment of the present invention. In this schematic view, the electrical terminal, the closed end and the opened end of the tubular housing are shown.

In reference to FIG. 9 and FIG. 10, the second alternative embodiment of the present invention, positions the flat radiant conversion device within an enclosure. Thus enabling this embodiment to function as a stand-alone lamp. The second alternative embodiment of the present invention further comprises a tubular housing 6, a light source 4, an electrical terminal 7, a face cap 8, and a lens 9. The tubular housing 6 is a rigid enclosure that comprises a closed end 61 and an open end 62 so that components may be mounted within an interior lumen. Additionally, the tubular housing 6 dissipates the heat generated by the light source 4, the radiant conversion device 3, and light reflecting off of the optical diaphragm 1. The light source 4 is mounted within the tubular housing 6 adjacent to the closed end 61. As a result, the light source 4 is maintained in a position which facilitates shining a beam of light through the transmission hole 2 and onto the radiant conversion device 3. The optical diaphragm 1, the diffractive optical element 10, and the radiant conversion device 3 are positioned within the tubular housing 6 adjacent to the light source 4 so that light generated by the light source 4 is able to pass through the transmission hole 2 and energize the radiant conversion device 3 after being split by the diffractive optical element 10. Furthermore, the light that is generated by the radiant conversion device 3, and reflected by the optical diaphragm 1, exits the tubular housing 6 through the open end 62. The lens 9 is positioned within the tubular housing 6, adjacent to the radiant conversion device 3. As a result, the lens 9 prevents the radiant conversion device 3 from coming into contact with objects in the external environment. The lens can be, but is not limited to, a flat transparent piece of glass, a curved lens designed to disperse light, or a curved lens designed to focus light. The lens 9, the radiant conversion device 3, the diffractive optical element 10, the optical diaphragm 1, and the light source 4 are pressed into the tubular housing 6 by the face cap 8. Consequently, the lens 9, the radiant conversion device 3, the diffractive optical element 10, the optical diaphragm 1, and the light source 4 are sandwiched between the face cap 8 and the closed end 61 while the face cap 8 is attached to the housing. The face cap 8 is detachably attached to the tubular housing 6, adjacent to the open end 62. Thus, the face cap 8 prevents the components stored within the tubular housing 6 from being removed, while attached to the tubular housing 6. Furthermore, the face cap 8 maintains the components stored within the tubular housing 6 in orientations which facilitate the light generated by the radiant conversion device 3 being directed into the external environment. The electrical terminal 7 is externally mounted onto the tubular housing 6 so that the housing can be connected to an external power supply. The light source 4 is electrically connected to the electrical terminal 7. As a result, the electrical power delivered to the electrical terminal 7 is transferred to the light source 4.

Figure 11:
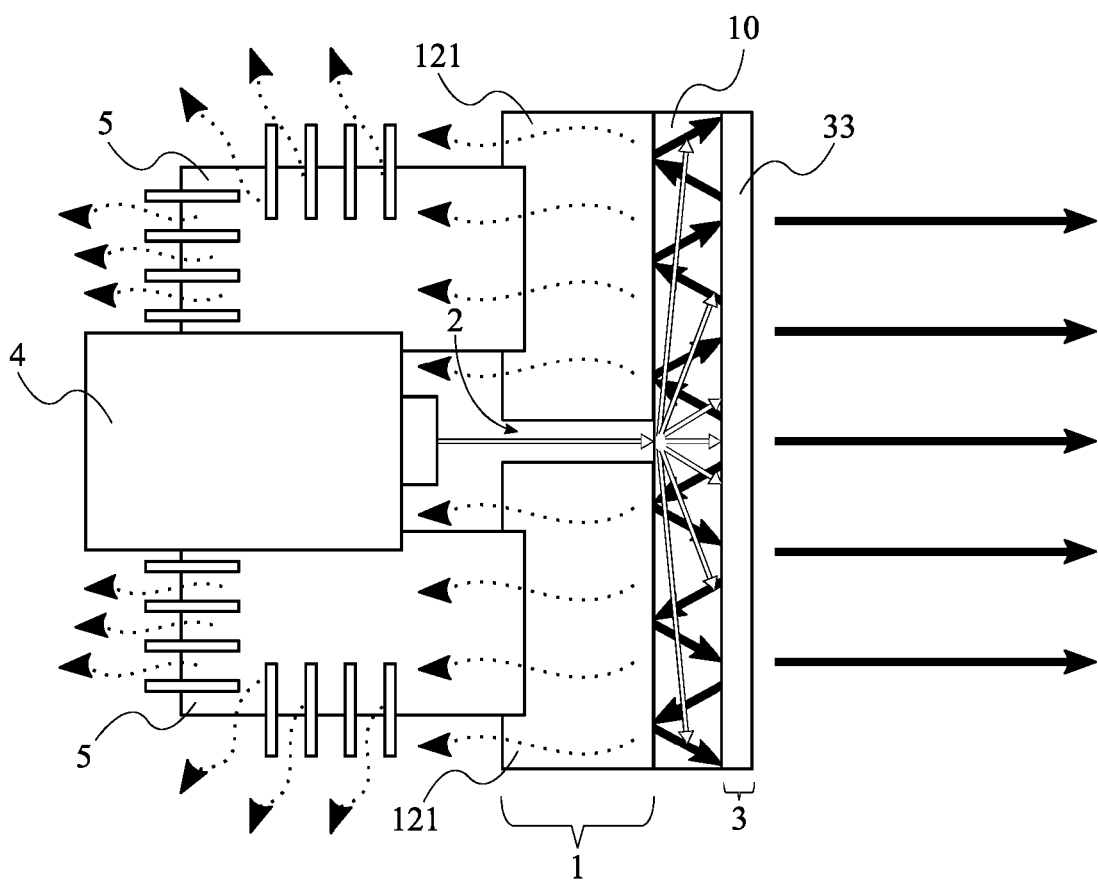
FIG. 11 is a schematic view of the third possible embodiment of the present invention. In this schematic view, the optical diaphragm has no reflective surface. Additionally, the heat sinking body is mounted adjacent to the heat sinking layer. Dotted lines indicate heat being transferred from the heat sinking layer, through the heat sinking body, and into the ambient environment.

In reference to FIG. 11, in a sixth alternative embodiment of the present invention the radiant conversion device 3 comprises a luminescent material coating 33. The optical diaphragm 1 comprises a heat sinking layer 121. The luminescent material coating 33 is superimposed onto the diffractive optical element 10 so that light generated by the light source 4 energizes the luminescent material coating 33, after passing through the diffractive optical element 10. To that end, the diffractive optical element 10 is positioned in between the luminescent material coating 33 and the heat sinking layer 121. Moreover, the heat sinking layer 121 is used to dissipate heat generated by light being generated by, and reflected off of, luminescent material coating 33. The heat sinking layer 121 is preferably made of aluminum.

In reference to FIG. 11, the sixth embodiment of the present invention further comprise a heat sinking body 5 which facilitates dissipating heat from the optical diaphragm 1. The heat sinking body 5 is mounted adjacent to the heat sinking layer 121, opposite to the diffractive optical element 10. Additionally, the heat sinking body 5 is in thermal communication with the heat sinking layer 121. Consequently, the heat sinking body 5 is able to dissipate the heat conducted through the heat sinking layer 121 into the ambient environment. In the sixth alternative embodiment of the present invention, the heat sinking body 5 is designed similarly to a traditional heat sink. Additionally, the heat sinking body 5 is mounted adjacent to the heat sinking layer 121 such that light generated by the light source 4 is able to pass unimpeded through the transmission hole 2.

Although the invention has been explained in relation to its preferred embodiment, it is to be understood that many other possible modifications and variations can be made without departing from the spirit and scope of the invention as hereinafter claimed.

What is claimed is:

1. A system for optimizing white light comprises:
   an optical diaphragm;
   a transmission hole;
   a diffractive optical element;
   a radiant conversion device;
   the radiant conversion device being in optical communication with the optical diaphragm through the diffractive optical element;
   the transmission hole traversing through the optical diaphragm;
   the transmission hole being oriented towards the radiant conversion device;
   the radiant conversion device comprises a transparent enclosure and a luminescent material coating;
   the optical diaphragm being a concave mirror assembly;
   the luminescent material coating being superimposed on a focusing surface of the transparent enclosure;
   the concave mirror assembly being mounted within the transparent enclosure;
   the transmission hole traversing into the transparent enclosure and through the concave mirror assembly;
   the transmission hole being aligned along a principal axis of the concave mirror assembly; and
   a focus of the concave mirror assembly being positioned coincident with the luminescent material coating.

2. The system for optimizing white light as claimed in claim 1, wherein the focusing surface is an internal surface of the transparent enclosure.

3. The system for optimizing white light as claimed in claim 1, wherein the transparent enclosure is a bulbus shape.

4. The system for optimizing white light as claimed in claim 1, wherein the concave mirror assembly is a single continuous mirror.

5. The system for optimizing white light as claimed in claim 1 comprises:
   the concave mirror assembly comprises a plurality of assembly portions;
   the plurality of assembly portions being arranged into a uniform reflective surface.

6. The system for optimizing white light as claimed in claim 1 comprises:
   a light source;
   the light source being mounted offset from the optical diaphragm, opposite to the radiant conversion device;
   an emission axis of the light source being collinearly aligned with the transmission hole; and
   the emission axis of the light source being oriented towards the radiant conversion device.

7. The system for optimizing white light as claimed in claim 6 comprises:
   the light source being a collimated light source.

8. The system for optimizing white light as claimed in claim 6 comprises:

the light source comprises at least one lamp, a support platform, and a base;

the at least one lamp being distributed onto and across the support platform;

the base being adjacently connected to the support platform, opposite to the at least one lamp; and the at least one lamp being electrically connected to the base.

9. The system for optimizing white light as claimed in claim 1 comprises:

the optical diaphragm comprises a reflective surface and a heat sinking layer;

the luminescent material coating being superimposed onto the diffractive optical element;

the diffractive optical element being positioned in between the luminescent material coating and the reflective surface;

the reflective surface being superimposed onto the heat sinking layer; and the reflective surface being positioned in between the heat sinking layer and the diffractive optical element.

10. The system for optimizing white light as claimed in claim 9, wherein the reflective surface and the diffractive optical element being offset from each other by a heat insulation gap.

11. The system for optimizing white light as claimed in claim 9, wherein the luminescent material coating is superimposed onto the diffractive optical element by an adhesion layer.

12. The system for optimizing white light as claimed in claim 9, wherein the heat sinking layer is made of aluminum.

13. The system for optimizing white light as claimed in claim 9 comprises:

a heat sinking body;

the heat sinking body being mounted adjacent to the heat sinking layer, opposite to the reflective surface; and the heat sinking body being in thermal communication with the heat sinking layer.

14. The system for optimizing white light as claimed in claim 9 comprises:

a tubular housing;

a light source;

an electrical terminal;

a face cap;

a lens;

the tubular housing comprises a closed end and an open end;

the light source being mounted within the tubular housing, adjacent to the closed end;

the optical diaphragm, the diffractive optical element, and the radiant conversion device being positioned within the tubular housing, adjacent to the light source;

the lens being positioned within tubular housing, adjacent to the radiant conversion device;

the lens, the radiant conversion device, the diffractive optical element, the optical diaphragm, and the light source being pressed into the tubular housing by the face cap;

the face cap being detachably attached to the tubular housing, adjacent to the open end;

the electrical terminal being externally mounted to the tubular housing; and the light source being electrically connected to the electrical terminal.

15. The system for optimizing white light as claimed in claim 1, wherein the diffractive optical element is a Gaussian diffuser.

16. The system for optimizing white light as claimed in claim 1, wherein the diffractive optical element is tuned to diffract light with a 450 nanometer wavelength.

17. The system and method of optimizing white light as claimed in claim 1 comprises:

the optical diaphragm comprises a heat sinking layer;

the luminescent material coating being superimposed onto the diffractive optical element; and the diffractive optical element being positioned in between the luminescent material coating and the heat sinking layer.

18. The system for optimizing white light as claimed in claim 17, wherein the heat sinking layer is made of aluminum.

19. The system for optimizing white light as claimed in claim 17 comprises:

a heat sinking body;

the heat sinking body being mounted adjacent to the heat sinking layer, opposite to the diffractive optical element; and the heat sinking body being in thermal communication with the heat sinking layer.

* * * * *